(12) United States Patent
Ogura (10) Patent No.: US 8,124,879 B2
(45) Date of Patent: Feb. 28, 2012

(54) PRINTED BOARD (75) Inventor: Motonari Ogura, Osaka (JP)

(73) Assignee: Panasonic Corporation, Osaka (JP)

( * ) Notice: Subject to any disclaimer, the term of this patent is extended or adjusted under 35 U.S.C. 154(b) by 638 days.

(21) Appl. No.: 12/301,409

(22) PCT Filed: May 18, 2007

(86) PCT No.: PCT/JP2007/060241
§ 371 (c)(1),
(2), (4) Date: Nov. 18, 2008

(87) PCT Pub. No.: WO2007/135997
PCT Pub. Date: Nov. 29, 2007

(65) Prior Publication Data
US 2009/0107700 A1 Apr. 30, 2009

(30) Foreign Application Priority Data
May 22, 2006 (JP) ................................ 2006-141145

(51) Int. Cl.
H05K 1/00 (2006.01)
(52) U.S. Cl. ............ 174/250; 174/260; 29/825; 29/829; 29/846
(58) Field of Classification Search .................. 174/250, 174/260; 29/825, 829, 831, 847
See application file for complete search history.

(56) References Cited

U.S. PATENT DOCUMENTS

| 3,723,176 A * | 3/1973 | Theobald et al. ............. 428/552 |
| 4,737,115 A * | 4/1988 | Seidler ............................. 439/83 |
| 6,835,897 B2 * | 12/2004 | Chang et al. .................. 174/255 |
| 7,086,600 B2 * | 8/2006 | Osawa et al. ................. 235/492 |
| 7,322,531 B2 * | 1/2008 | Osawa et al. ................. 235/492 |
| 7,467,464 B2 * | 12/2008 | Osawa et al. ................... 29/841 |
| 2002/0177335 A1 | 11/2002 | Tsuchioka |
| 2004/0056104 A1 * | 3/2004 | Osawa et al. ................. 235/492 |

FOREIGN PATENT DOCUMENTS

| JP | 06-232523 | 8/1994 |
| JP | 08-279680 | 10/1996 |
| JP | 09-008416 | 1/1997 |
| JP | 2000-151035 | 5/2000 |
| JP | 2000-294721 | 10/2000 |
| JP | 2000-353863 | 12/2000 |
| JP | 2003-46273 | 2/2003 |
| JP | 2005-294650 | 10/2005 |

OTHER PUBLICATIONS

International Search Report for PCT/JP2007/060241; Jun. 7, 2007.

* cited by examiner

Primary Examiner — Robert J Hoffberg
(74) Attorney, Agent, or Firm — Pearne & Gordon LLP (57) ABSTRACT A printed wiring board includes a substrate member, terminals and wiring pattern. The terminals are formed in a specific shape on the substrate member and arranged to be aligned in a specific arrangement direction on the substrate member. The wiring pattern is formed on the opposite side across the substrate member from a terminal portion where the terminals are formed, and a plurality of slits are formed extending in a direction perpendicular to the specific arrangement direction.

11 Claims, 8 Drawing Sheets

PRINTED BOARD

CROSS-REFERENCE TO RELATED APPLICATIONS

This U.S. National stage application claims priority under 35 U.S.C. §119(a) to Japanese Patent Application No. 2006-141145, filed in Japan on May 22, 2006, the entire contents of which are hereby incorporated herein by reference.

FIELD OF THE INVENTION

The present invention relates to a printed board, and more particularly relates to printed board in which a terminal is provided to a substrate member.

BACKGROUND ART

As today's electronic devices become increasingly lighter, thinner, and smaller, there has been an attendant reduction in the thickness of the printed wiring boards that are installed inside these devices. A problem encountered with thin printed wiring boards is substrate warping. There are many causes behind substrate warping, such as warping caused by the manufacturing process, warping caused by temperature load, and warping caused by external load, and there is a particular need for warping caused by temperature load to be eliminated.

During reflow in the mounting of components, the substrate is put under a high-temperature environment of 200° C. or higher, and substrates made of composite materials consisting of copper foil, a base material, and a resist undergo warping due to the difference in the amounts of thermal expansion of the various constituent materials. Warping happens particularly often with portions to which the terminals, such as terminals of components and terminals directly connecting the substrate to the outside, are wired, because of the difference in the amounts of copper foil on the terminal face where the terminal is, and the terminal rear face on the opposite side. This warping causes improper mounting of the components, and therefore needs to be suppressed, but at present the most common approach is to employ a means such as providing perforations as disclosed in Patent Document 1 and elsewhere.

Other measures besides making perforations include a technique for suppressing warping by forming a dummy pattern corresponding to a warped state when a substrate warps, as disclosed in Patent Document 2.

Patent Document 1: Japanese Laid-Open Patent Application H9-8416

Patent Document 2: Japanese Laid-Open Patent Application 2000-151035

DISCLOSURE OF THE INVENTION

However, regarding the ideal location of the perforations and their effect, it is necessary to take into account many different factors, such as the shape of the substrate, how it is warped, the balance of the perforations, and so on.

Also, making perforations is a method for forcibly suppressing substrate warping, and when there is residual stress in the substrate after it has been cooled to normal temperature, this stress is sometimes released by cutting the perforations, and warping occurs. Thus, there has been a need to suppress warping with just the substrate itself, without using perforations.

In particular, the substrates of memory cards, typified by SD cards and mini-SD cards, are super-thin, with a thickness of only about 0.2 to 0.35 mm, and they also have low stiffness, the result being that the terminal portions are extremely prone to warping. Thus, at the present time, with the rear face portions of terminals, there is a pronounced tendency to mount electronic components that are small enough to allow mounting even if the substrate warps, or to mount electronic components that have few terminals, or to avoid mounting at all, and a problem is that the effective mounting surface area is diminished.

We also have the technique disclosed in Patent Document 2, but the shape of the effective dummy pattern has to be figured out for every substrate, including the substrate thickness, the substrate material, and the balance with the perforations, so a problem is that it is difficult to determine the shape.

In view of this, it is an object of the present invention to solve such problems and provide a technique for suppressing warping of portions where terminals are formed, with just the substrate itself, even though no perforations are used, and reducing improper mounting.

The printed board according to a first aspect of the present invention includes a substrate member, terminals, and wiring. The terminals are formed in a specific shape on the substrate member and arranged to be aligned in a specific arrangement direction on the substrate member. The wiring is formed on the opposite side across the substrate member from the position where the terminals are formed, and a plurality of slits are formed extending in a direction perpendicular to the specific arrangement direction.

With the above-mentioned printed board, the "substrate member" is a board-shaped member constituted by an insulated board, for example. The "terminals" are printed wiring applied by printing on the substrate member in order to electrically connect to a device other than the printed board or to components mounted on the printed board, and are constituted by copper foil, for example. The "wiring" is printed wiring applied by printing on the substrate member, and is constituted by copper foil, for example. The "arrangement direction" is the direction in which the terminals are aligned on the substrate. For instance, if the planar shape of the terminals is quadrangular, and the terminals are disposed facing each other so that their sides are parallel to one another, the direction perpendicular to two parallel sides on the substrate is the arrangement direction.

With this printed board, the wiring is formed on the opposite side across the substrate member from the position where the terminals are formed. This makes it possible to suppress the amount of warping at the portions where the terminals are formed. Specifically, it is possible to suppress warping of the portions where the terminals are formed, with just the substrate itself, even though no perforations are used, and to reduce improper mounting.

Also, since the amount of warping can be suppressed with just the substrate itself, this solves the problems associated with providing perforations. For instance, no residual stress is generated by constriction at the perforations, and no warping is caused by the release of this stress after cutting the perforations. With the present invention, warping can be suppressed regardless of the material of the substrate member, its thickness, the shape of the perforations, and so forth.

The printed board according to a second aspect of the present invention is the printed board of the first aspect of the present invention, wherein the substrate member extends in a direction perpendicular to the specific arrangement direction. The terminals extend in a direction perpendicular to the specific arrangement direction.

The printed board according to a third aspect of the present invention is the printed board of the second aspect of the present invention, wherein the wiring is in substantially the same shape as the specific shape.

Here, "substantially the same shape" may, for example, be a shape that is the same when viewed from the surface side, or may be a shape that is the same when viewed all the way through from one surface side.

The printed board according to a fourth aspect of the present invention is the printed board of the third aspect of the present invention, wherein the plurality of slits are provided substantially in parallel on the substrate member. The total width of the plurality of slits in the specific arrangement direction is between 5 and 35% of the width of the substrate member in the specific arrangement direction.

The printed board according to a fifth aspect of the present invention is the printed board of the fourth aspect of the present invention, wherein the total width of the plurality of slits in the specific arrangement direction is between 13 and 32% of the width of the substrate member in the specific arrangement direction.

The printed board according to a sixth aspect of the present invention is the printed board of the fifth aspect of the present invention, wherein the total width of the plurality of slits in the specific arrangement direction is between 15 and 29% of the width of the substrate member in the specific arrangement direction.

The printed board according to a seventh aspect of the present invention is the printed board of the sixth aspect of the present invention, wherein the total width of the plurality of slits in the specific arrangement direction is between 4 and 6 mm.

The printed board according to an eighth aspect of the present invention is the printed board of the seventh aspect of the present invention, wherein the shape of the substrate member or the specific shape of the terminals is a shape that complies with SD card specifications.

The printed board according to a ninth aspect of the present invention is the printed board of the eighth aspect of the present invention, wherein the shape of the substrate member or the specific shape of the terminals is a shape that complies with mini-SD card specifications.

The printed board according to a tenth aspect of the present invention is the printed board of the ninth aspect of the present invention, wherein the substrate member is made up of a plurality of layers. The wiring is formed on any layer on the opposite side across the thickness direction center of the substrate member from the layer on which the terminals are formed.

BEST MODE FOR CARRYING OUT THE INVENTION

Embodiments according to the present invention will be described through reference to FIGS. 1A to 12. In this description, constituent elements that have the same function will be numbered the same.

First Embodiment

Figure 1A:
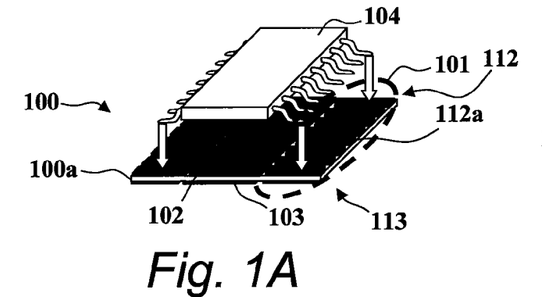
FIGS. 1A to 1D are simplified diagrams of the configuration of a printed wiring board in a first embodiment according to the present invention.
Figure 1B:
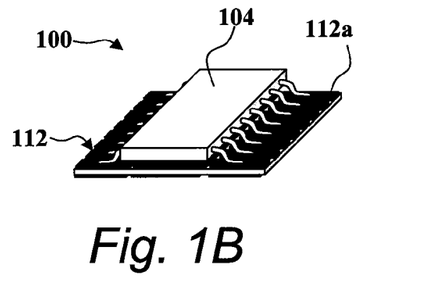
Figure 1C:
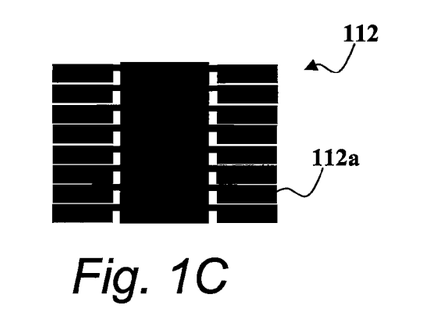
Figure 1D:
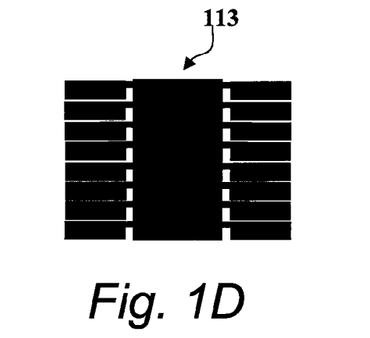

FIGS. 1A and 1B show a printed wiring board 100 in a first embodiment of the present invention, while FIGS. 1C and 1D are schematics of the wiring pattern (printed wiring) of the printed wiring board 100.

A reference numeral 112 in FIGS. 1A to 1C is a wiring pattern printed on a terminal face 102 side of a substrate member 100a of the printed wiring board 100, and a reference numeral 113 in FIGS. 1A and 1D is a wiring pattern printed on a terminal rear face 103 side as viewed all the way through the substrate member 100a from the terminal face 102 side.

As shown in FIGS. 1A and 1B, an electronic component 104 is mounted on terminals 112a of a wiring pattern 112 on the printed wiring board 100 in this embodiment. The material of the substrate member 100a is generally a glass fiber-reinforced resin such as FR-4 (a standard glass epoxy that is flame resistant and heat resistant), over which the wiring patterns 112 and 113 are formed with copper foil.

With the printed wiring board 100, a plurality of the terminals 112a on which the electronic component 104 is mounted are formed in the wiring pattern 112. The wiring pattern 113 on the terminal rear face 103 side of the terminal portion 101, which is the region where the plurality of terminals 112a are formed, has substantially the same shape as the terminals 112a. Specifically, similar slits are formed as shown in FIGS. 1C and 1D. Here, "substantially the same shape" may, for example, be a shape that is the same when viewed from the surface side (the terminal face 102 side and the terminal rear face 103 side), or may be a shape that is the same when viewed all the way through from one surface side (the terminal face 102 side or the terminal rear face 103 side).

Because of the above, the wiring surface area is equal between the terminal face 102 and the terminal rear face 103 with the terminal portion 101, and the amount of wiring is also equal between the terminal face 102 side and the terminal rear face 103 side, using the center of the substrate member 100a in its thickness direction as a reference. That is, the printed wiring board 100 has a shape that is symmetrical in the thickness direction using the thickness direction center as a reference, and the amount of expansion when heat is applied is also equal, so warping can be suppressed. This means that improper mounting of the electronic component 104 on the terminals 112a can be suppressed.

Figure 2A:
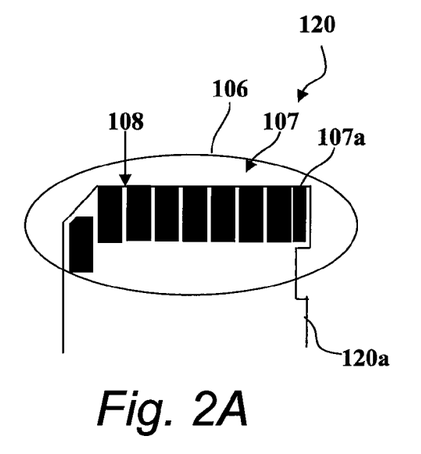
FIGS. 2A and 2B are simplified diagrams of the configuration of an SD card substrate in a first embodiment according to the present invention.
Figure 2B:
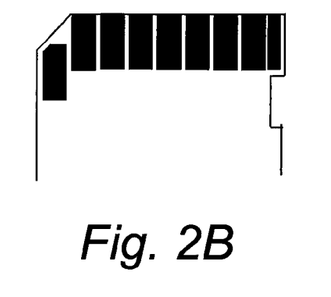

FIGS. 2A and 2B show the wiring pattern when the printed wiring board complies with SD card specifications. With an SD card substrate 120, the wiring pattern 107 of a terminal portion 106 has a shape determined by specifications, and has a common wiring pattern for the entire SD card substrate. In the drawing, the parts filled in with black are the wiring pattern 107, which is composed of copper foil and formed on a substrate member 120a, and the white portions are slits 108 where no copper foil is formed. FIG. 2A shows the wiring pattern on the terminal face side, while FIG. 2B shows the wiring pattern on the terminal rear face side when viewed all the way through the substrate member 120a from the terminal face side.

A total of nine terminals 107a are formed on the terminal face side of the SD card substrate 120, and the slits 108 are formed in between these terminals 107a (see FIG. 2A). As shown in FIG. 2B, substantially the same wiring pattern as that formed on the terminal portion 106 is formed on the terminal rear face side of the SD card substrate 120.

With a conventional SD card substrate, slits caused serious warping of the terminal portion of the SD card substrate, and it was difficult to mount components on the terminal rear face side of the terminal portion where the terminals were formed. In contrast, with the SD card substrate 120 of this embodiment, the same wiring pattern as that on the terminal face side is formed on the terminal rear face side of the terminal portion 106, which suppresses warping of the terminal portion 106. The result is a structure that suppresses warping with just the substrate itself, without using perforations in the terminal portion.

As shown in FIG. 2A, the terminals 107a are arranged so that they are aligned in the left and right direction in FIG. 2A (the specific arrangement direction). The terminals 107a and the slits 108 extend in the up and down direction in FIG. 2A (the direction perpendicular to the specific arrangement direction). The wiring pattern is similar to the wiring pattern 107 in that slits are formed extending in the up and down direction in FIG. 2A. The SD card substrate 120 extends in the up and down direction in FIG. 2A.

Thus, with this SD card substrate 120, a wiring pattern having substantially the same shape as that of the terminals 107a extends in the lengthwise direction of the SD card substrate 120. In addition, the copper foil or other metal that forms the terminals portion 107 and the wiring pattern has better mechanical properties (such as the Young's modulus) than the substrate member 120a. Accordingly, the strength of the SD card substrate 120 is increased by the wiring pattern formed on the terminal rear face side and a terminal portion 160. In particular, this increases the strength against bending in the lengthwise direction of the SD card substrate 120 generated during connector plug-in.

Working examples according to this embodiment will now be given.

Working Example 1

A case of applying the wiring pattern of this embodiment to printed wiring boards of different structures will be described through reference to FIGS. 3A to 3C.

Figure 3A:
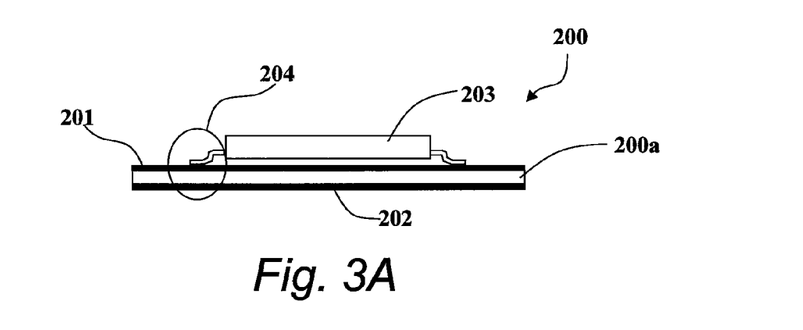
FIGS. 3A to 3C are simplified diagrams of the configuration of a printed wiring board in Working Example 1 according to the present invention.
Figure 3B:
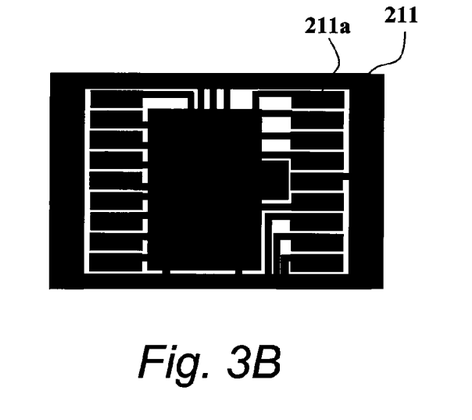
Figure 3C:
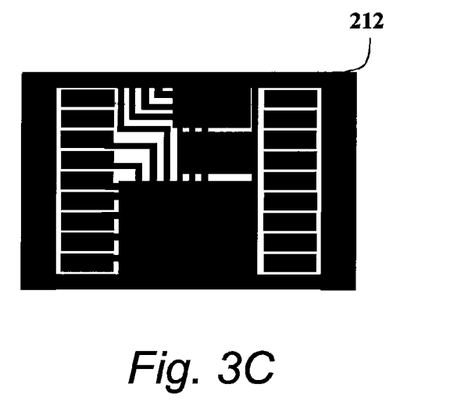

FIG. 3A is an external view of a printed wiring board 200 serving as a working example. A reference numeral 211 in FIG. 3b is a wiring pattern formed on a terminal face 201. A reference numeral 212 in FIG. 3C is a wiring pattern formed on a terminal rear face 202 when viewed all the way through a substrate member 200a from the terminal face 201 side. In FIGS. 3B and 3C, the parts filled in with black are the wiring patterns 211 and 212, which are composed of copper foil and formed over the substrate member 200a, and the white portions are portions where no copper foil has been formed.

The printed wiring board 200 is a double-sided board whose core material (the substrate member 200a) is FR-4, and the wiring patterns 211 and 212 are formed from copper foil. An electronic component 203 is mounted on the terminal face 201 of the printed wiring board 200. This electronic component 203 is a quad flat package (QFP), with nine terminals on each side of the chip, for a total of 18. The terminal face 201 of the printed wiring board 200 is printed with terminals 211a (lands) corresponding to the number of terminals of the electronic component 203. Further, the terminal rear face 202, which is the face on the opposite side from the terminal face 201, is printed with substantially the same wiring pattern 212. In particular, the terminal rear face 202 side of the terminal portion 204 printed with the terminals 211a is printed with the same wiring pattern 212. The part of the wiring pattern 212 that particularly needs to be the same as the wiring pattern 211 is on the terminal rear face 202 side of the terminal portion 204, but if possible, it is preferable for the pattern to be the same around this part as well. Doing this reduces the likelihood that the printed wiring board 200 will warp due to the effect of the surrounding portion of the wiring pattern 211.

With the structure described above, warping of the terminal portion 204 of the printed wiring board 200 can be suppressed, allowing more stable component mounting.

Second Embodiment

Figure 4:
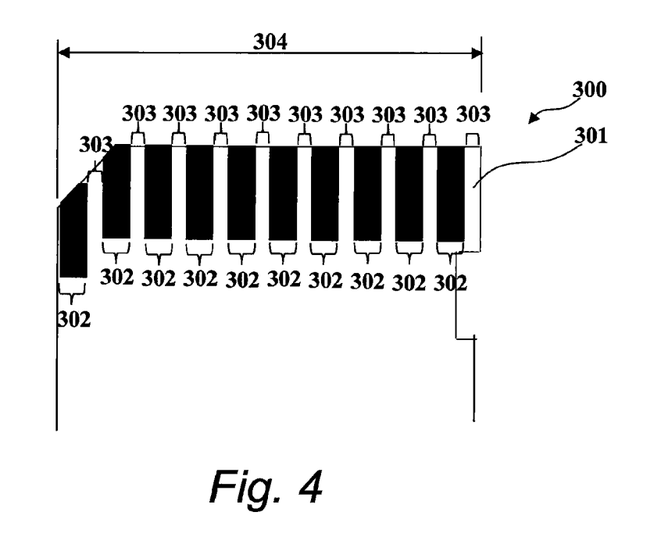
FIG. 4 is a simplified diagram of the configuration of an SD card substrate in a second embodiment according to the present invention.

FIG. 4 shows the wiring pattern of an SD card substrate 300 in a second embodiment according to the present invention. With the SD card substrate 300 shown in FIG. 4, since the layout of the terminals on the terminal face side is as stipulated by the above-mentioned specifications, the following description will apply only to the wiring pattern of a terminal rear face 301 when viewed all the way through the substrate member from the terminal face side. Further, on the terminal face side, terminals are disposed at positions roughly corresponding to the wiring pattern shown in FIG. 4. Specifically, a plurality of terminals on the terminal face side are arranged to be aligned facing in the short-side direction (the left and right direction in FIG. 4) of the SD card substrate 300, and slits extending in the long-side direction (the up and down direction in FIG. 4) are formed in between these terminals.

As shown in FIG. 4, the wiring pattern of the terminal rear face 301 according to this embodiment has long slits 303 made in the lengthwise direction (the wiring pattern on the terminal face side) of the SD card substrate 300, and the total width of the slits 303 is about 13 to 32% of the width 304 of the SD card substrate 300 in the short-side direction.

This keeps warping of the terminal portion of the SD card substrate 300 to less than 100 μm with just the substrate itself, and reduces warping of the terminal portion of the SD card substrate 300 to less than the 100 μm substrate warping that is generally held to be caused by improper mounting with a flash memory chip mounted on a thin device such as an SD card. Furthermore, if the substrate warping is less than 100 μm, then it will be possible to mount all electronic components on the main substrate, including QFP-type flash memories, bare chip-type flash memories, substrates on which bare chips are mounted, controller chips, and so forth that are of a size that allows mounting in a thickness space of approximately 1 mm or less, which is stipulated in SD card specifications.

Further, if the total width of the slits 303 is set to about 15 to 29% of the width 304 in the short-side direction of the SD card substrate 300, the amount of warping can be kept to 80 μm or less. Within the range of 15 to 29%, even when mounting is performed with solder balls having a diameter of only 80 μm, which is the smallest size in the world at present, it will be possible to effectively prevent part of the mounted portion from disconnecting completely, which would result in improper mounting.

Figure 5A:
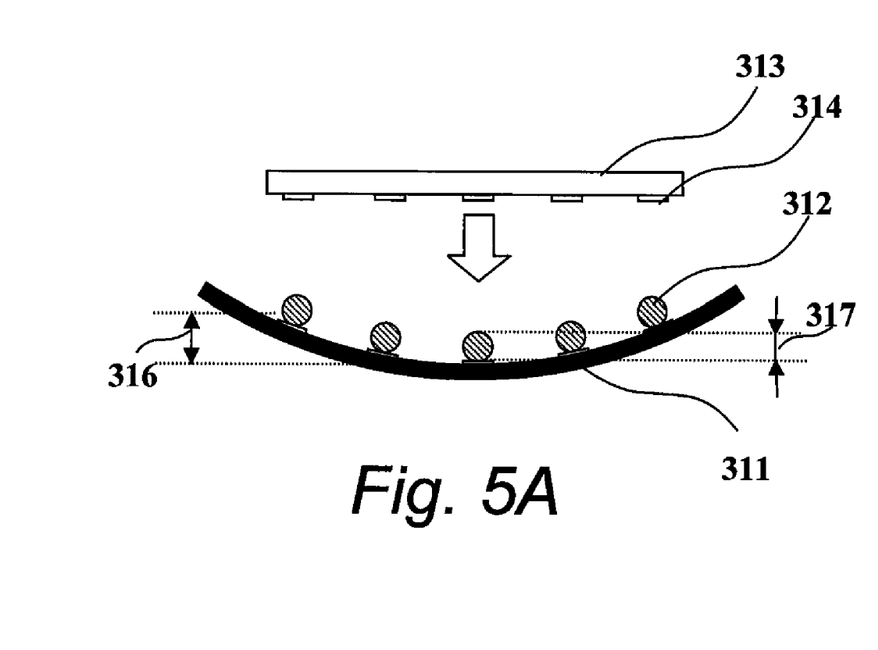
FIGS. 5A and 5B are diagrams of improper mounting.

This will be described through reference to FIGS. 5A and 5B. FIG. 5A is a schematic diagram of before a component is mounted on a terminal portion of the SD card substrate 300, and FIG. 5B is a schematic diagram of after component mounting.

Figure 5B:
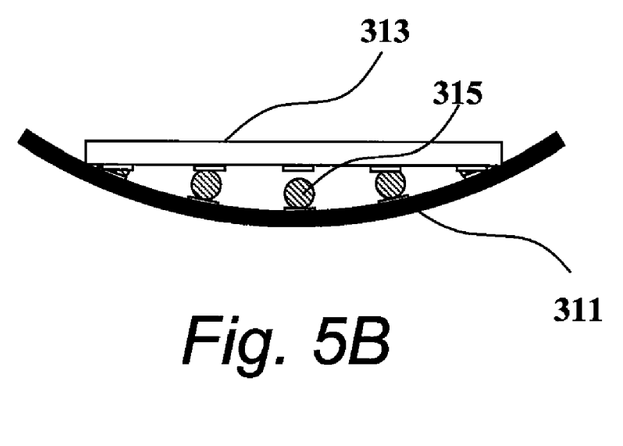

A reference numeral 311 in FIGS. 5A and 5B is a cross section in the short-side direction of the SD card substrate 300, and a reference numeral 312 is a solder ball, which are readied for use during the mounting of an electronic component 313 on the substrate. An electronic component having pads 314 on its bottom face is mounted, as with the electronic component 313. In this situation, as shown in FIG. 5B, if the amount of warping 316 of the SD card substrate 300 is greater than the diameter 317 of the solder balls 312, there will be a solder ball 315 that is completely disconnected. In this embodiment, this warping of the SD card substrate 300 is prevented by forming a wiring pattern 302 that is divided up by the slits 303 on the terminal rear face 301.

Figure 6:
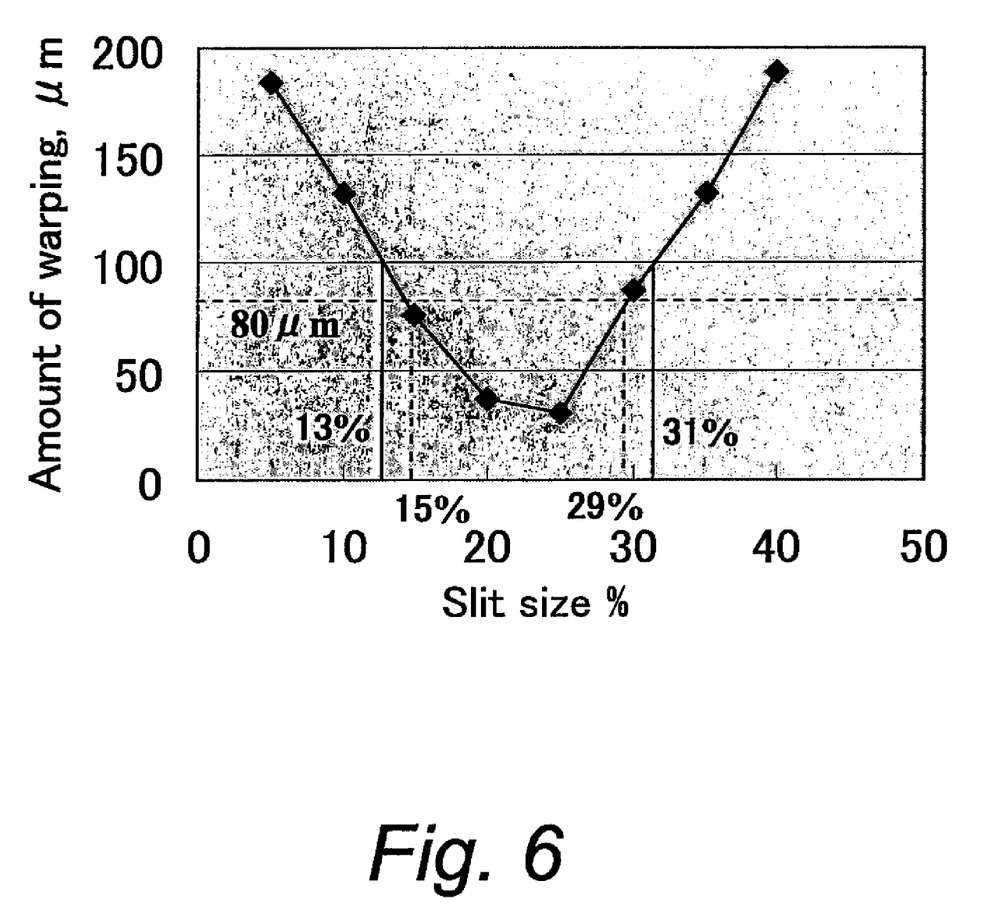
FIG. 6 is a graph of the relationship between an amount of warping and slit size with an SD card substrate.

FIG. 6 is a graph of the results of simulating the relationship between an amount of warping of the SD card substrate 300 and slit size (the total slit width) provided between the wiring pattern 302, using a finite element method. As shown in FIG. 6, if the slit size is between 13 and 32% as stated above, the amount of warping of the SD card substrate 300 will be kept under 100 μm, and if it is between 15 and 29%, the amount of warping of the SD card substrate 300 will be kept under 80 μm.

The length of the slits 303 is preferably from 4 to 6 mm, which is about the same length as the terminals on the terminal face. If the slits 303 are not long enough because of the length of the terminals on the terminal face, the terminals will warp up to about 6 mm from the substrate. Therefore, for warping due to the shape of the terminals to be completely suppressed, the length should be about 4 to 6 mm.

A "slit" as defined in this embodiment refers to any rectangular shape having its long side in the lengthwise direction of the terminals, when the area with no copper foil is divided up into rectangular shapes by just lines parallel to the lengthwise direction of the terminals.

Figure 7A:
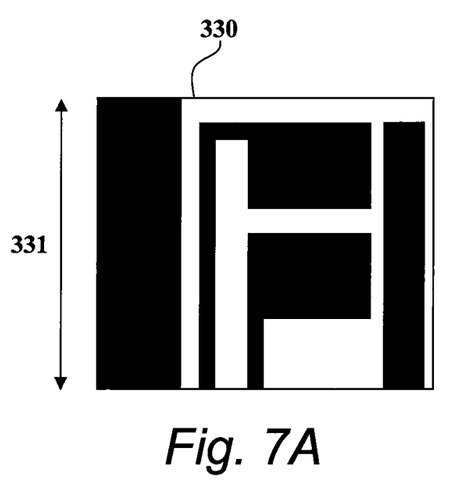
FIGS. 7A to 7C are simplified diagrams of the wiring pattern in a second embodiment according to the present invention.
Figure 7B:
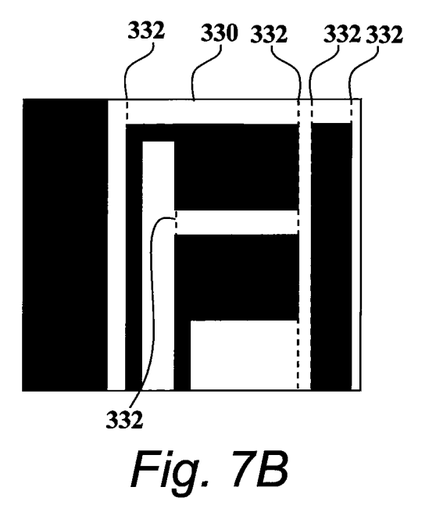
Figure 7C:
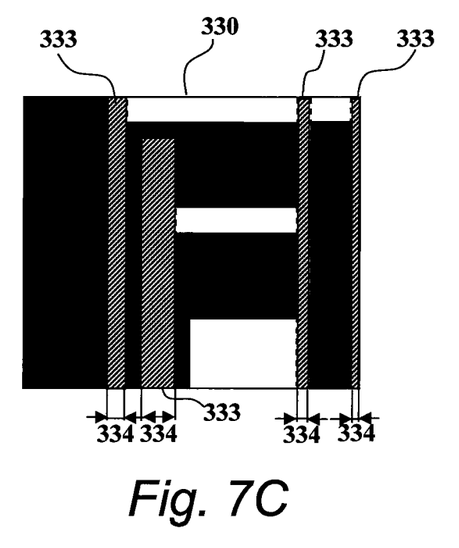

This will be described through reference to FIGS. 7A to 7C. The area 330 shown in FIGS. 7A to 7C is part of the terminal rear face when the viewed all the way through the substrate member from the terminal face side. In FIGS. 7A to 7C, the parts filled in with black are a wiring pattern printed with copper foil, and the white portions are the area not printed with copper foil. A reference numeral 331 in the drawings indicates the lengthwise direction of the terminals.

FIG. 7A shows the state before the area 330 is divided up into rectangular shapes, FIG. 7B shows the state when the area 330 has been divided up into rectangular shapes, and FIG. 7C shows the parts that correspond to "slits" out of the rectangular shapes produced by the division. In the drawings, the division lines 332 are broken lines, while the slits 333 are indicated by hatching. When the area 330 with no copper foil is divided up by the above method, the area 333 are rectangular in shape, having their long sides in the terminal lengthwise direction, while the other rectangular shapes (the white portions) are rectangles that do not have their long sides in the terminal lengthwise direction. In other words, the former are rectangles corresponding to "slits" as defined in the present invention, while the latter are rectangles that do not correspond to "slits." Thus, the width of the slits as defined in the present invention is the width of the portions numbered 334 in FIG. 7C.

Figure 8:
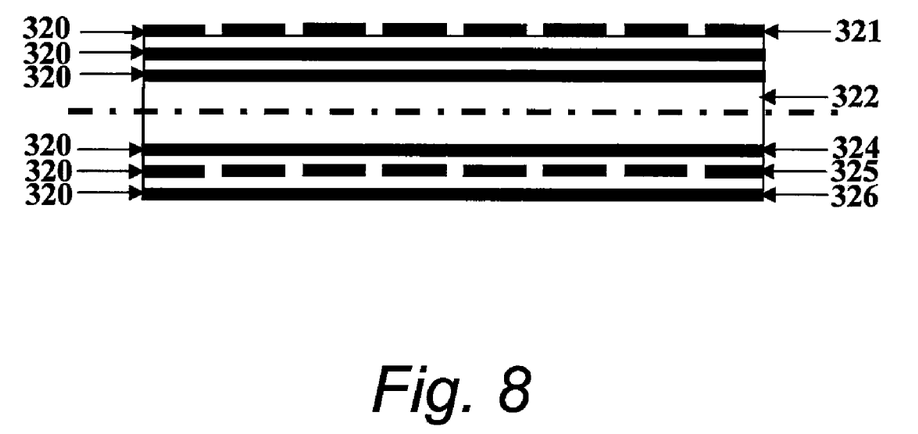
FIG. 8 is a cross section of a printed wiring board according to the present invention.

It is also possible to apply the present invention to a multilayer substrate as in FIG. 8. As shown in FIG. 8, this multilayer substrate has wiring layers 320 and a terminal layer 321, which is one of these wiring layers 320 that has terminals. In this case, the effect of the present invention will be obtained as long as the above-mentioned slits are provided to a layer on the opposite side from the terminal layer 321, that is one of the layers 324 to 326 on the terminal rear face side, with respect to a core layer 322, when the core layer 322 is the layer located in the middle in the thickness direction of the multilayer substrate (in the drawing, 325 is the slit layer). Strictly speaking, however, it is better for the terminal layer and the slit layer to be in symmetry with respect to the thickness direction center of the multilayer substrate, and in principle, it is ideal for the slits to be provided to the layer 326 (the outermost wiring layer) on the terminal rear face with respect to the terminal layer 321. This applies not only to the SD card substrate 300, but to other printed wiring boards as well.

In the above description, the slits 303 are provided uniformly in the arrangement direction of the slits 303, but the positions where the slits 303 are provided may be varied depending on the component that is mounted on the SD card or the printed wiring board. Specifically, the slits 303 need not be provided uniformly. Furthermore, when a component is mounted on the rear face of the terminal portion, the gaps (portions with no copper foil) formed according to the land shape or routing of the wiring necessary for mounting may also be considered to be "slits," and this may be included in calculation of the slit size. A working example according to this embodiment will now be given.

Working Example 2

Figure 9:
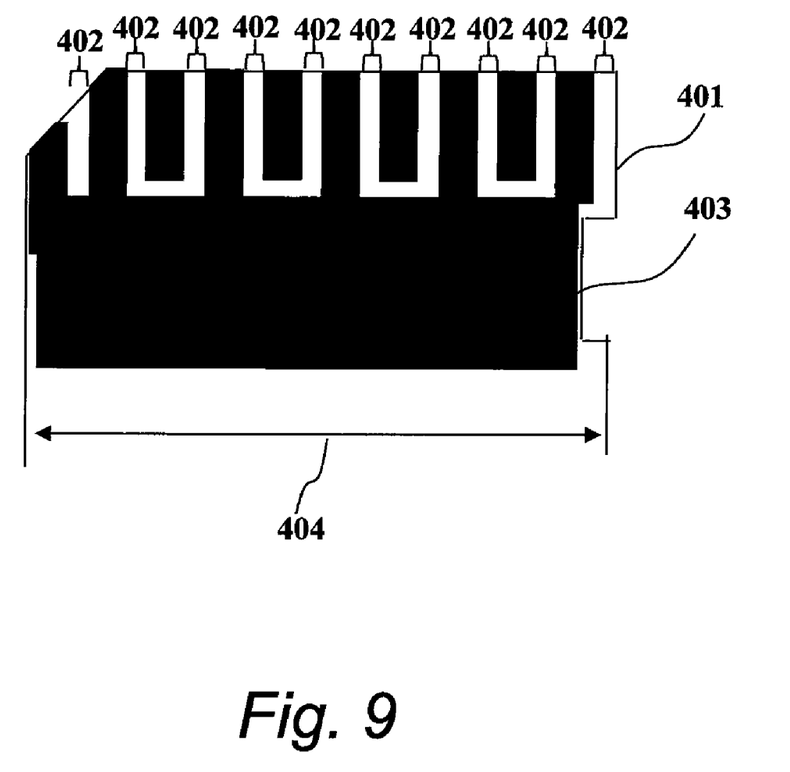
FIG. 9 is a simplified diagram of the configuration of an SD card substrate in Working Example 2 according to the present invention.

FIG. 9 shows a different wiring pattern on the terminal rear face of an SD card. FIG. 9 shows the wiring pattern on the terminal rear face when viewed all the way through the substrate member from the terminal rear face side.

In FIG. 9, a reference numeral 401 shows a substrate member of an SD card substrate 400 according to the present invention. The parts filled in with black are a copper foil wiring pattern 403 printed on a substrate member 401, and of the white portions, the portions indicated by 402 are "slits," out of the portion where no copper foil has been formed.

The substrate member 401 is a double-sided board made from FR-4, but the substrate member may be made from any material. The total width of the slits in this modification example is 25% versus the short-side length 404 of the SD card. This was confirmed to keep the amount of warping in the short-side direction to 30 μm.

Third Embodiment

Figure 10A:
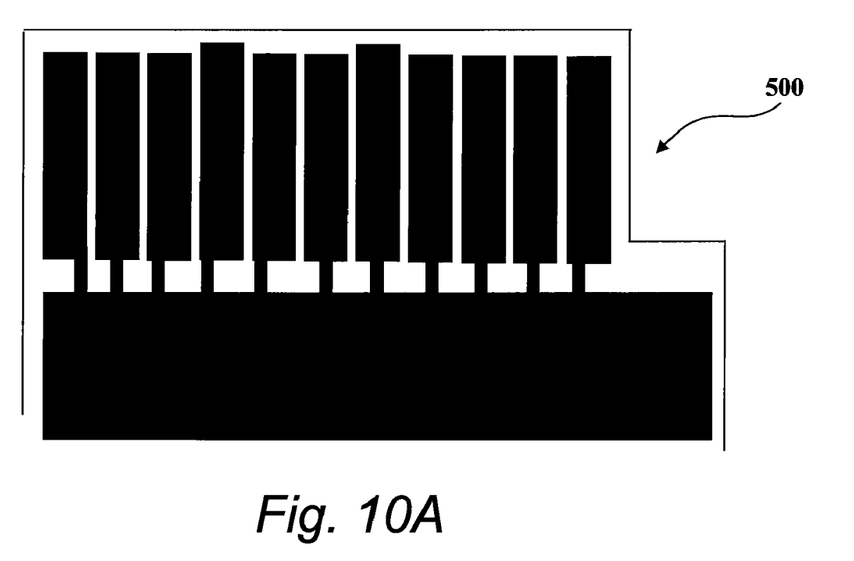
FIGS. 10A and 10B are simplified diagrams of the configuration of a mini-SD card substrate in a third embodiment of the present invention.
Figure 10B:
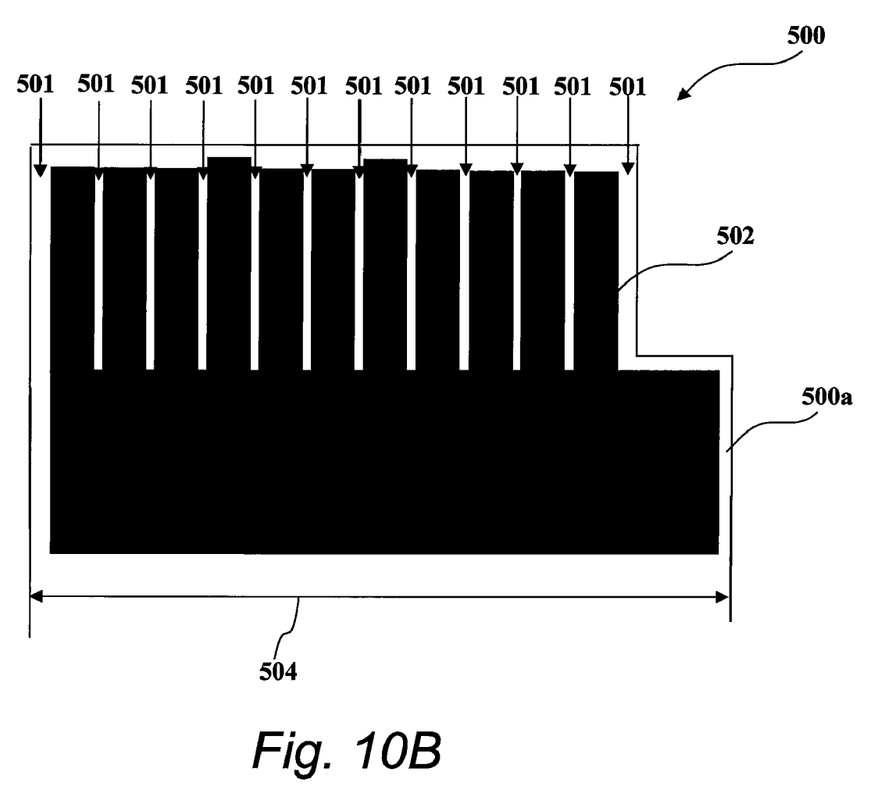

FIGS. 10A and 10B show the wiring pattern of a mini-SD card in a third embodiment according to the present invention. FIG. 10A shows the wiring pattern on the terminal face of a mini-SD card substrate 500 that complies with mini-SD card specifications, and FIG. 10B shows the wiring pattern on the terminal rear face 500a, which is the face on the opposite side from the terminal face. In FIG. 10B, the parts filled in with black are a wiring pattern 502 printed with copper foil or another such conductor, and slits 501 (the white portions) are provided to the wiring pattern 502. As can be seen from FIGS. 10A and 10B, the slits 501 in the terminal rear face 500a are formed at substantially the same positions as those formed between the lands of the wiring pattern on the terminal face, and this suppresses warping of the terminal portion during high-temperature load.

With the mini-SD card substrate 500 of the present invention, even when a wiring pattern 502 that is the same as on the terminal face is not provided, as in FIG. 10B, in component mounting, etc., it is preferable for the quantity of the slits 501 to be from 5 to 35% of the width 504 in the short-side direction (the left and right direction in FIG. 10B) of the mini-SD card. This keeps warping of the terminal portion under 80 μm, even when mounting is performed with solder balls having a diameter of only 80 μm, which is the smallest size in the world at present, it will be possible to effectively prevent part of the mounted portion from disconnecting completely, which would result in improper mounting. This principle was described through reference to FIGS. 5A and 5B, and will not be described again here.

Figure 11:
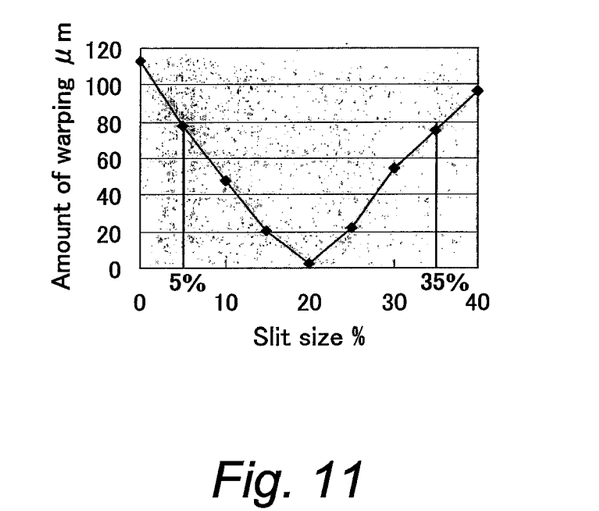
FIG. 11 is a graph of the relationship between an amount of warping and slit size with a mini-SD card substrate.

FIG. 11 is a graph of the results of simulating the relationship between an amount of warping of the mini-SD card substrate 500 and slit size (the total slit width) provided between the wiring pattern 502, using a finite element method. As shown in FIG. 11, if the slit size is between 5 and 35% as stated above, the amount of warping of the mini-SD card substrate 500 will be kept under 80 μm.

The length of the slits 501 is preferably from 4 to 6 mm, which is about the same length as the terminals on the terminal face (see FIG. 10B). This is because if the slits 501 are far too short, this will diminish the effect of the slits 501 to suppress warping.

A working example according to the present invention will now be given.

Working Example 3

Figure 12:
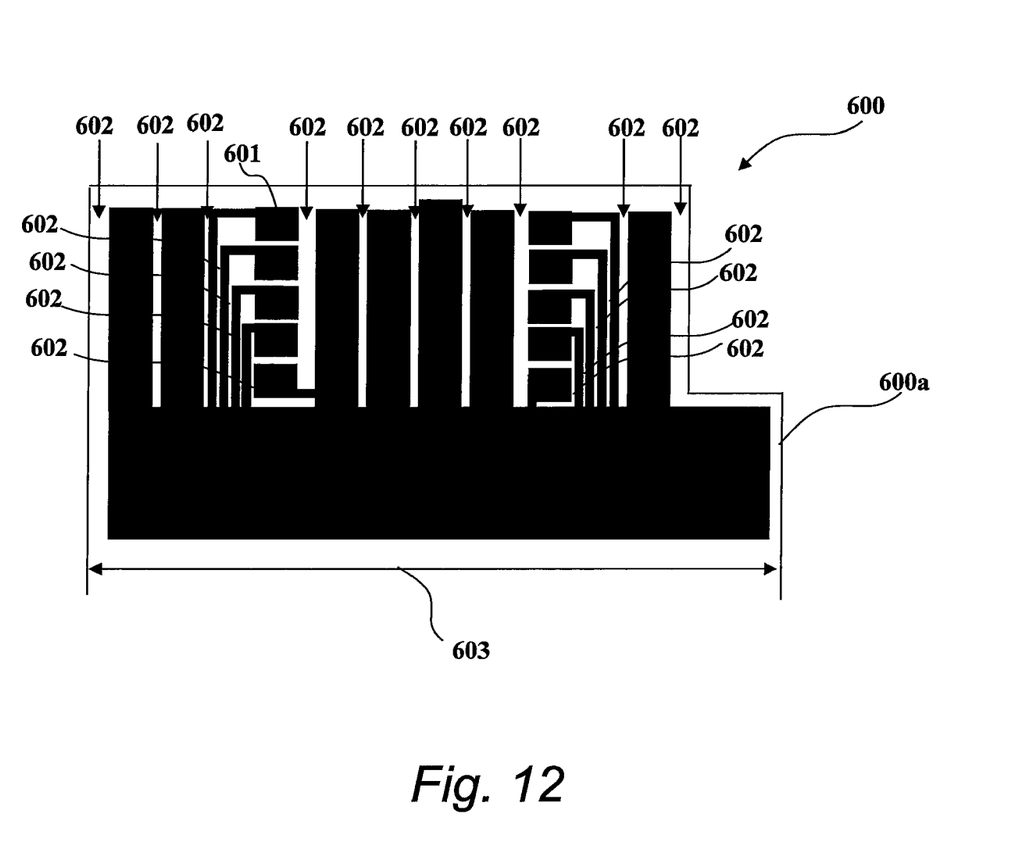
FIG. 12 is a simplified diagram of the configuration of a mini-SD card substrate in Working Example 3 according to the present invention.

FIG. 12 shows the wiring pattern on a terminal rear face 600a when viewed all the way through the substrate member from the terminal face side of a mini-SD card substrate 600. The parts filled in with black are a wiring pattern printed with copper foil on the terminal rear face 600a, and of the white portions, the rectangular shapes that are longer in the lengthwise direction of the mini-SD card substrate 600 are the slits 602 in the present invention. The total width of the slits 602 is approximately 27% of the width 603 in the short-side direction of the mini-SD card, and an electronic component is mounted over the wiring pattern on the terminal rear face 600a. 601 here is a terminal (pad) on which an electronic component is mounted. In this working example, the slits 602 are formed while avoiding the terminals 601.

As a result, the amount of warping of the portion where terminals are formed on the terminal face side can be kept to approximately 40 μm, allowing the electronic component to be mounted stably.

The invention claimed is:
1. A printed board, comprising:
a substrate member having a thickness direction center, the substrate member is made up of a plurality of layers;
a plurality of terminals formed in a specific shape on a first layer of the plurality of layers, the first layer formed on a first side of the thickness direction center of the substrate member, the plurality of terminals arranged to be aligned in a specific arrangement direction on the substrate member; and
wiring formed on one of inner layers of the plurality of layers disposed on an opposite side of the thickness direction center from the first side from the position where the plurality of terminals are formed, and the wiring having a plurality of slits extending in a direction perpendicular to the specific arrangement direction, wherein the wiring is in substantially a same shape as the specific shape.

2. The printed board according to claim 1,
wherein the substrate member extends in a direction perpendicular to the specific arrangement direction, and
the plurality of terminals extend in a direction perpendicular to the specific arrangement direction.

3. The printed board according to claim 2,
wherein the plurality of slits are provided substantially in parallel on the substrate member, and
a total width of the plurality of slits in the specific arrangement direction is between 5 and 35% of the width of the substrate member in the specific arrangement direction.

4. The printed board according to claim 3,
wherein the total width of the plurality of slits in the specific arrangement direction is between 13 and 32% of the width of the substrate member in the specific arrangement direction.

5. The printed board according to claim 4,
wherein the total width of the plurality of slits in the specific arrangement direction is between 15 and 29% of the width of the substrate member in the specific arrangement direction.

6. The printed board according to claim 5,
wherein the total width of the plurality of slits in the specific arrangement direction is between 4 and 6 mm.

7. The printed board according to claim 2,
wherein the plurality of slits are provided substantially in parallel on the substrate member, and
a total width of the plurality of slits in the specific arrangement direction is between 5 and 35% of the width of the substrate member in the specific arrangement direction.

8. The printed board according to claim 7,
wherein the total width of the plurality of slits in the specific arrangement direction is between 13 and 32% of the width of the substrate member in the specific arrangement direction.

9. The printed board according to claim 8,
wherein the total width of the plurality of slits in the specific arrangement direction is between 15 and 29% of the width of the substrate member in the specific arrangement direction.

10. The printed board according to claim 9,
wherein the total width of the plurality of slits in the specific arrangement direction is between 4 and 6 mm.

11. The printed board according to claim 2,
wherein the total width of the plurality of slits in the specific arrangement direction is between 4 and 6 mm.

* * * * *